United States Patent [19]

Schiffman

[11] 4,102,734
[45] Jul. 25, 1978

[54] METHOD FOR PRODUCING A DESIGN ON AN ARCUATE SURFACE

[75] Inventor: Murray M. Schiffman, Westport, Conn.

[73] Assignee: MBI, Inc., Westport, Conn.

[21] Appl. No.: 729,764

[22] Filed: Oct. 5, 1976

[51] Int. Cl.² .................. B44C 1/22; C03C 15/00; C03C 25/06
[52] U.S. Cl. .................. 156/659; 96/27 R; 96/36; 156/645; 156/661; 353/50; 353/121; 355/48; 355/49; 355/77; 427/282
[58] Field of Search .................. 350/120, 123; 353/46, 353/50, 79, 80, 121, 122; 427/259, 282; 96/36, 36.2, 37, 32, 38.1–38.4, 27 R; 156/659, 660, 661, 645; 355/77, 48–53

[56] References Cited

U.S. PATENT DOCUMENTS

| 2,073,313 | 3/1937 | Murray | 96/36.2 X |
| 2,153,166 | 4/1939 | Wynd | 96/37 X |
| 2,288,352 | 6/1942 | Henderson | 96/37 X |
| 3,573,045 | 3/1971 | Lemelson | 156/58 X |
| 3,649,394 | 3/1972 | Erickson | 156/345 X |

Primary Examiner—William A. Powell
Attorney, Agent, or Firm—Cooper, Dunham, Clark, Griffin & Moran

[57] ABSTRACT

Method and apparatus for producing a design on a preformed arcuate surface by etching and/or selective plating. The design is transferred to the arcuate surface by progressively and successively projecting narrow images of the design from a flat form and progressively rotating an arcuate surface about its axis such that the narrow images of the design are successively projected upon and received by corresponding portions of the arcuate surface.

8 Claims, 6 Drawing Figures

METHOD FOR PRODUCING A DESIGN ON AN ARCUATE SURFACE

BACKGROUND OF THE INVENTION

The present invention relates to the production of a design on an arcuate or irregular surface. More particularly, the invention relates to method and apparatus for transferring a flat design onto an arcuate surface.

Multi-colored metal designs have been produced on flat surfaces using conventional photographic masking techniques to allow successive selective etching and/or metal deposition corresponding to each color effected, as in U.S. Pat. No. 2,731,333 to Ko. Such surfaces can then be curved or pressed into a desired shape, such as in U.S. Pat. No. 3,503,815 to Johnson. However, this procedure is limited by the extent and manner in which the surface can be formed without marring the design.

It is also known to engrave arcuate surfaces, such as by use of a pantograph device, as in U.S. Pat. No. 3,830,136 to Sprenger. However, such a device normally is not used to produce a complicated or fancy design because of the substantial hand labor which is necessary. It is not readily adaptable to mass production of highly patterned bowls, jewelry, bells and the like.

SUMMARY OF THE INVENTION

It is a primary object of this invention to provide a method of reproducing a design on an arcuate surface. It is another object of this invention to provide a useful means for producing an etched and/or multi-finished design in a readily repeatable manner as for a production run on each of many pieces having a given preformed arcuate shape. A further object is to provide apparatus for readily producing designs on differently shaped surfaces and/or in different proportions, as for a set, or prototypes, or custom or sample items. It is still another object to provide a method for the successive application of a resist coat on a preformed arcuate surface corresponding to the finish-separated patterns of a multi-finished design so as to allow corresponding etching and/or superimposition of different metals or other coatings by conventional means to reproduce such a design on such surface.

The method of the present invention provides a means to generate design patterns either on a set of form-fitting masks or stencils or directly onto an arcuate surface. This is achieved by projection of successive portions of the design patterns onto corresponding portions of the masks or stencils or surfaces as they are moved or rotated in synchronization with one another.

In the apparatus of the invention, a design in a flat form is created upon a transparency. Narrow images from the transparency are progressively and successively projected toward an arcuate surface, which is provided with a photosensitive coating. The arcuate surface, which may be either an inside or outside surface, is progressively rotated about its axis, which is maintained substantially perpendicular to the projected narrow areas. The arcuate surface rotation is synchronized with the progressive projection of the narrow images such that the narrow images, which are so oriented as to be in the plane of the axis of rotation of said arcuate surface, are successively projected upon and received by the surface. After exposure, the coating is fixed and the unexposed portion dissolved. The latter area of the surface is then etched, plated or otherwise processed.

If the arcuate surface is itself a form-fitting mask or stencil, it can be used for repetitive transference of the design.

DETAILED DESCRIPTION

Generally, photoetching or selective photoplating of a surface is accomplished by applying a photoresist coating to the surface to be processed and then light-exposing that portion not to be etched or plated through a corresponding transparency or mask held in close contact to the surface. The light-exposed resist is then fixed and the unexposed resist is dissolved. When the surface is immersed in an etching or plating solution, processing will take effect selectively only where the resist has been removed, thus producing a desired pattern. This process is readily accomplished where the surface to be processed is flat and close contact with a flat transparency or mask can be established. However, in the case of a non-cylindrical arcuate surface, it is difficult to conform the desired design image to any extensive area of the arcuate surface by the above-described conventional techniques.

Conformance of the design image from a conventional flat transparency or mask to an arcuate surface is accomplished in accordance with the present invention by projecting successive narrow images from the transparency or mask upon corresponding successive narrow portions of a photoresist-coated arcuate surface. The narrow images from the transparency are projected relatively perpendicular to the arcuate surface and in a plane of the axis of the arcuate surface.

Figure 1:
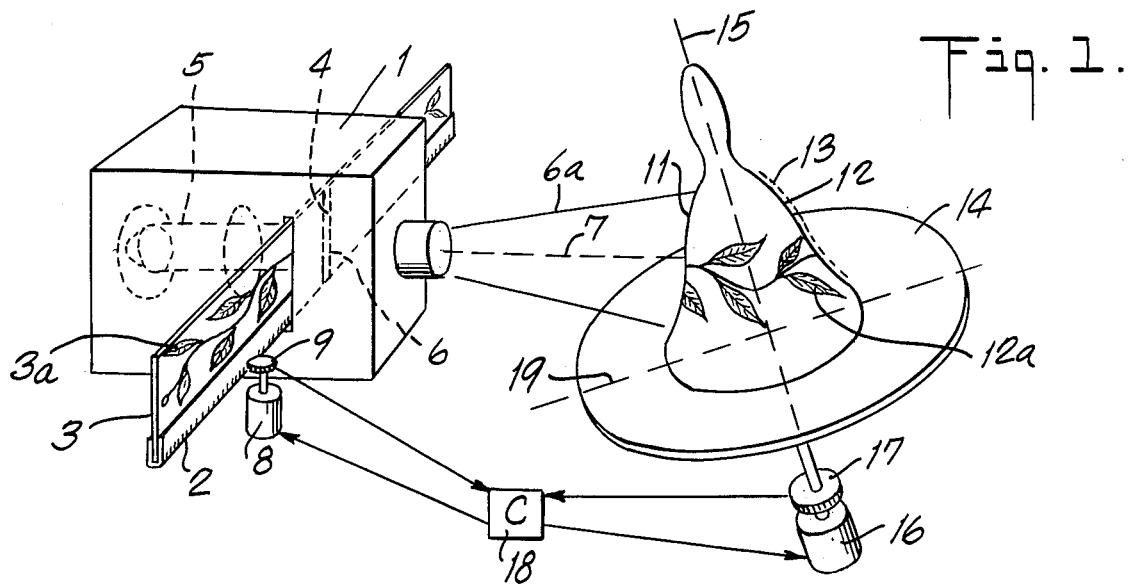
FIG. 1 is a perspective view of apparatus for synchronously projecting successive portions of a design pattern onto an outer arcuate surface in accordance with the invention.

Referring to FIG. 1 of the drawings, a projector 1 of a conventional type is provided with a movable carrier 2 which is adapted to hold a transparency or mask 3 having a design pattern 3a thereon. A narrow opening or slit 4 is provided in the path of a projection light 5. This narrow opening 4 is about ⅛ in. wide, although other size openings may be suitable. A motor 8 progressively drives the carrier 2 acrosss the path of the light 5 by means of a gear train 9. Narrow areas 6 of the transparency 3 are progressively and successively moved into the path of the light 5, when registered with the narrow opening 4. Light and dark narrow images 6a corresponding to the pattern at the respective narrow areas 6 of the transparency 3 are thereupon successively projected in the direction of the light beam axis 7. As used herein, the term "narrow area" means each successive portion of the transparency which is exposed to the light source at the narrow slit 4, similarly to the well-known projection technique of slides or phootographic transparencies.

The projected narrow images 6a from the transparency are displayed upon and received by corresponding narrow areas 11 of arcuate surface 12, e.g. a bell. The arcuate surface 12 is provided with a photoresist coating 13. Portions of the coating 13 are thereby exposed to the projected images. After the entire surface has been progressively and successively exposed at the narrow areas 11, an entire design pattern 12a is created on the arcuate surface 12 corresponding to the flat pattern 3a on the transparency or mask 3.

The arcuate surface 12 is held up on a rotatable table 14 having a rotation axis 15. This axis 15 is located and tiltable in the plane of the projected narrow images 6a. Preferably, the axis 15 is tilted to a position such that any arcuate narrow area 11 is substantially perpendicular to the axis 7 of the projected narrow images 6a. This results in each point along the length of the narrow areas 11 being within the sphere of focus. The table 14 is rotatable by a motor 16, either directly or through a gear train 17. Rotation of the table 14 is synchronized with the linear motion of the carrier 2 for proper positioning and exposure time of the successive narrow areas 11. Synchronization can be accomplished by providing carrier speed sensing means and table speed sensing means at the respective gears 9 and 17. A controller 18 of any conventional type adjustably controls the individual and relative speeds of the carrier motor 8 and the table motor 16. The relative speeds of the carrier 2 and the table 14 depend upon the relative sizes of the transparency and arcuate surface. If there is a 1:1 size relation, the peripheral movement of the surface should equal the linear movement of the carrier and transparency. Successive patterns may be registered by an index mark 19 and conventional start and stop controls (not shown).

To transfer a design for etching and/or plating on the arcuate surface, the projector 1 is positioned relative to and focused upon the convex arcuate surface 12 for desired image size. The photoresist-coated arcuate surface 12 is centered on the table 14 and positioned relative to the table index mark 19. A first transparency or mask 3 is positioned on the carrier 2. Synchronized motion of the carrier 2 and the table 14 is initiated and continued through a complete exposure of successive narrow images 6a of the pattern on the photoresist-coated surface 12. The arcuate surface 12 is removed and processed for etching or plating in the conventional manner, for example, as in U.S. Pat. No. 3,503,815 to Johnson. To process a successive pattern, a new coating of photoresist 13 is applied to the arcuate surface 12 and the above described cycle is repeated. A desired etched and/or multi-finished design is thereby produced on the arcuate surface 12.

Figures 2, 6:
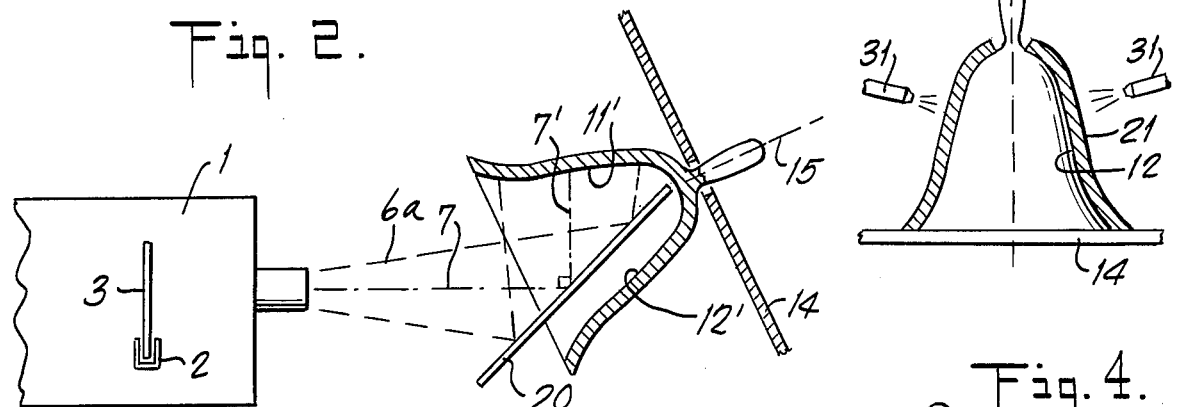
FIG. 2 is a sectional elevational view of apparatus for synchronously projecting successive portions of a design pattern onto an inner arcuate surface.
FIG. 6 is a sectional elevational view of a multiple sand-blasting chamber useful in the method of the invention.

The process and apparatus of the invention also are adapted for inside or concave surface processing as shown in FIG. 2. In FIG. 2, the same numerals are used as in FIG. 1, and prime numbers designate reverse surfaces or features. The arcuate surface 12' is reversely positioned on table 14. A mirror 20 is positioned near rotation axis 15, in line with the projected narrow images 6a and at a 45° angle to the axis 7 of the projected narrow images. The projected narrow images 6a are reflected by the mirror 20 along their full height and are displayed upon and received by corresponding narrow areas 11' on the surface. The rotation axis 15 is tilted as before such that reflected projection beam axis 7' is substantially perpendicular to the inside arcuate surface narrow area 11'. Of course, the transparency should be reversed or the direction of rotation of the arcuate surface should be reversed because of the intervention of the mirror 20. Processing is the same as described above with respect to FIG. 1.

The arcuate surface 12 may itself be a form-fitted mask, stencil or transparency. This mask may then be used in mass producing a series of articles.

Figures 3, 4, 5:
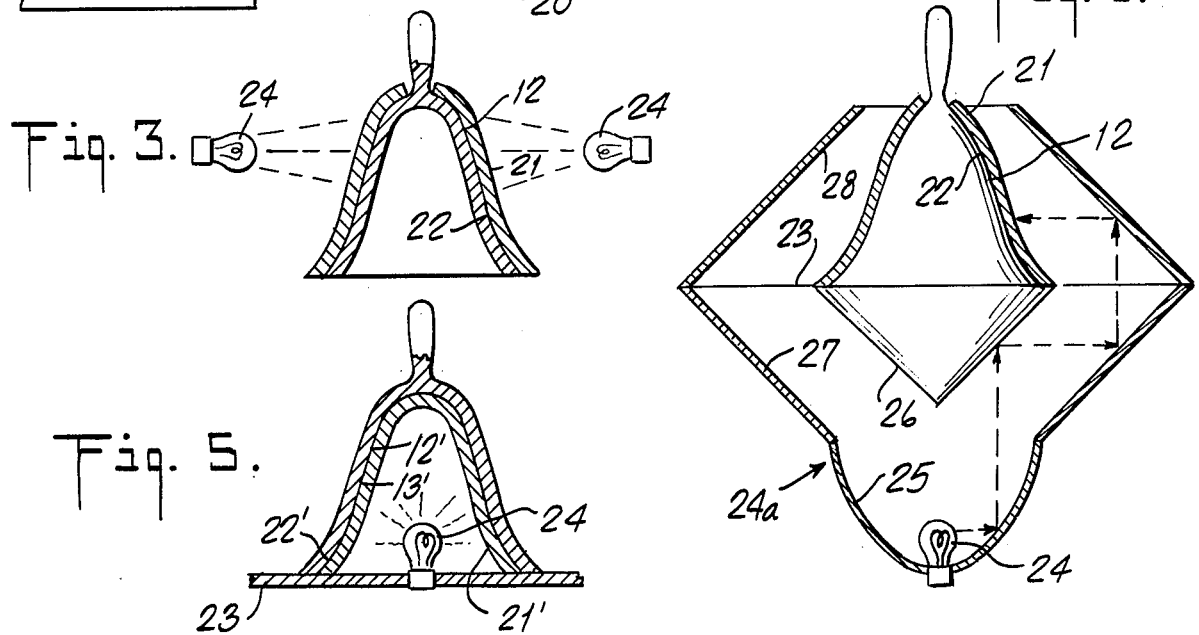
FIG. 3 is a sectional elevational view of a form-fitted transparency or mask pattern placed on an outer arcuate surface.
FIG. 4 is a sectional elevational view of an exposure chamber for exposing a photosensitized arcuate surface to form-fitting mask patterns useful in the method of the invention.
FIG. 5 is a sectional elevational view of a form-fitted transparency or mask pattern placed on an inside arcuate surface.

For preparing a large number (or more than several) of the same shaped surfaces with the same designs, an expeditious mass production method desireably is employed. This modification permits the use of a simple light source and the simultaneous exposure of all areas of the arcuate surface once the mask has been formed. As shown in FIG. 3, a form-fitted transparency or mask 21 is placed over a matching arcuate surface 12. Such transparencies or masks may be formed or cast from transparent acrylic or like material and photosensitized on the surface 22 thereof which contacts the arcuate surface 12 to be processed. The pattern for an outside mask is formed by the method shown in FIG. 2 and for an inside mask by the method shown in FIG. 1. The transparency surface 22 then is exposed to light sources 24 and then developed and fixed by conventional photographic means to produce an image on said surface. An inside-coated outside mask 21 and its photosensitized inside surface 22 are exposed for transferring a design pattern to an outside arcuate surface 12. An outside-coated inside mask and its photosensitized outside surface are exposed for transferring a design pattern to an inside arcuate surface (FIG. 5). Form-fitted transparency or mask sets may be used to produce successive design patterns on the arcuate surface. The arcuate surface is processed in the conventional manner by successively photoresist-coating, contact exposing, fixing or developing, and etching or plating as required.

Masks produced in this way may also be etched through to form stencils for use in coating the arcuate surface. After positioning a stencil 21 or 21' on the arcuate surface 12 or 12', either a final or a resist coating is applied by spray, brush or other deposition means. As a resist coat, subsequent processing for etching and/or plating would be carried out in the conventional manner.

This procedure is also useful in etching a crystal arcuate surface. A resist coat, such as wax, gum or varnish, is applied through the stencil on the portions of the arcuate surface not to be etched or engraved, leaving the uncoated portion available for etching, engraving, and/or coating. The process may be repeated using different stencils as needed for etching or engraving different finishes and/or depths on selected portions subject to the particular etching solution and manner and duration of application. For example, pure hydrofluoric acid will dissolve glass, leaving the surface clear and bright; when mixed with sulphuric acid it produces a high gloss on lead crystal. Adding a neutralizing agent such as ammonia produces a frosted effect. Sprinkling grains of mica evenly over the glass surface results in a stippled texture. (See The Collectors Dictionary of Glass E. M. Elville, Country Life Ltd. 1961, pp. 92–93.)

Stencils prepared in this manner are useful for etching an arcuate surface by a sand-blasting technique. The stencil itself is used to protect the portion not to be etched. Again, different stencils could be used to achieve different finishes and/or depths on selected portions subject to type and size of sand grains, pump pressure and nozzle size, and duration of exposure. A method of multiple sand blasting is shown in FIG. 6. The arcuate surface 12 with a stencil 21 is placed on a rotary table 14 such that it rotates about its axis 15. Multiple nozzles 31 are adjustably positioned to blast sand substantially centrally and perpendicular to the arcuate surface. The arcuate surface 12 is rotated uniformly through one (or more) revolutions before a selected activated nozzle or nozzles 31 corresponding to a selected stencil 21. Stencils 21 may be changed and selected nozzles 31 activated in accordance with the particular design requirement.

FIG. 4 illustrates another embodiment of exposure apparatus for form-fitted mask preparation of an outside arcuate surface 12. The photoresist-coated arcuate surface 12 rests on a platform 23. The platform 23 is located within a light box 24a comprising a light source 24, a parallel-ray mirrored surface 25, a mirrored conical surface 26, an opposing inside mirrored conical surface 27, and a second opposing inside mirrored conical surface 28. The form-fitted mask 21 is placed over the arcuate surface 12 to be exposed to the pattern on the inside surface 22 of the mask 21. The light source 24 is turned on for a specified time and exposure illumination. This is a substantially shorter exposure time and illumination than in the process of FIGS. 1 and 2 because of the simultaneous exposure of all areas of the arcuate surface. The time period and illumination are dependent upon the light source efficiency, distance from the surface, type of surface material, sensitivity of the controls, desired contrast and other factors. The light successively is reflected from mirrored surfaces 25, 26, 27 and 28, and through mask 21, exposing the photoresist-coated arcuate surface 12 to the pattern on the inside mask surface 22. The arcuate surface is then processed as above described. Alternatively, a plurality of lights 24 could be used to expose all areas of the arcuate surface simultaneously, as in FIG. 3.

FIG. 5 illustrates a method for exposing an inside arcuate surface 12' to a form-fitted mask pattern. The mask 21' is placed inside the surface 12' which is provided with a photosensitized coating 13'. The surface 12' is placed on a platform 23 over light source 24, which is turned on for a specified period. The photosensitized arcuate surface 12' is exposed to the pattern on the outside surface 22' of the mask 21'. Again, the arcuate surface is processed in the same manner.

The above descriptions are intended to be illustrative of methods for conforming flat design patterns to arcuate surfaces and should not be construed to be limiting. The present invention has a substantial use in the production of bowls, bells, jewelry and other collectibles having an arcuate or other irregular surface. The word "arcuate", as used herein, is intended to mean irregular, non-flat surfaces of various sizes and shapes. Many other uses of the invention will be apparent to those working in this and related fields.

I claim:

1. A method of producing a design on an arcuate surface, comprising:
    (a) forming the design upon a relatively flat transparency;
    (b) progressively and sequentially exposing narrow areas of the transparency to a directional light source whereby images of the design are progressively and sequentially projected in the direction of the light;
    (c) providing the arcuate surface with a photosensitive coating;
    (d) disposing the arcuate surface spaced from the transparency such that narrow areas thereof are progressively and sequentially maintained substantially perpendicular to the direction of the light and substantially parallel with the projected images;
    (e) rotating the arcuate surface about its axis in synchronization with the progressive movement of the transparency such that the projected images of the design are progressively and sequentially received by said narrow areas of the arcuate surface such that all points within said narrow areas are within the sphere of focus and the design is exposed upon the photosensitive coated arcuate surface;
    (f) processing the exposed coating on the arcuate surface to selectively produce the design upon the surface.

2. A method according to claim 1 wherein said arcuate surface is an outside surface.

3. A method according to claim 1 wherein said arcuate surface is an inside surface.

4. A method according to claim 1 wherein the arcuate surface is a form-fitted mask which receives the projected narrow images of the design.

5. A method according to claim 1 wherein the arcuate surface is a stencil which receives the projected narrow images of the design.

6. A method according to claim 1 wherein the arcuate surface is a transparency which receives the projected narrow images of the design.

7. A method according to claim 1 further comprising:
    (g) applying the arcuate surface bearing the design to an arcuate base of substantially the same shape and dimensions;
    (h) providing the arcuate base with a photosensitive coating;
    (i) exposing the arcuate surface and the arcuate base to a light source to transfer the design from the arcuate surface to the arcuate base; and
    (j) processing the exposed coating on the arcuate base to produce the design thereon.

8. A method according to claim 1 further comprising repeating each of the steps thereof to produce a second design upon the arcuate surface.

* * * * *